(12) United States Patent
Peyrot et al.

(10) Patent No.: US 10,211,170 B2
(45) Date of Patent: Feb. 19, 2019

(54) POWER TRANSISTOR WITH HARMONIC CONTROL

(71) Applicant: NXP USA, Inc., Austin, TX (US)

(72) Inventors: Pascal Peyrot, Frouzins (FR); Olivier Lembeye, Saint Lys (FR); Sai Sunil Mangaonkar, Chandler, CA (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/674,368

(22) Filed: Aug. 10, 2017

(65) Prior Publication Data

US 2018/0061785 A1 Mar. 1, 2018

(30) Foreign Application Priority Data

Aug. 24, 2016 (EP) ..................................... 16306079

(51) Int. Cl.
*H01L 23/52* (2006.01)
*H01L 21/44* (2006.01)
(Continued)

(52) U.S. Cl.
CPC ............ *H01L 23/66* (2013.01); *H01L 23/642* (2013.01); *H01L 24/49* (2013.01); *H03F 1/0205* (2013.01); *H03F 1/565* (2013.01); *H03F 3/195* (2013.01); *H03F 3/604* (2013.01); *H01L 2223/6611* (2013.01); *H01L 2223/6655* (2013.01); *H01L 2224/48227* (2013.01); *H01L 2224/49175* (2013.01); *H01L 2924/00014* (2013.01); *H01L 2924/1304* (2013.01); *H01L 2924/19041* (2013.01); *H01L 2924/30107* (2013.01); *H01L 2924/30111* (2013.01);

(Continued)

(58) Field of Classification Search
CPC ....... H01L 23/66; H01L 23/642; H01L 24/49; H03F 1/565
USPC .......................................... 257/691; 438/129
See application file for complete search history.

(56) References Cited

U.S. PATENT DOCUMENTS 3,893,159 A 7/1975 Martin
5,095,285 A 3/1992 Khatibzadeh
(Continued)

FOREIGN PATENT DOCUMENTS

EP 0 612 142 A2 8/1994
GB 2 489 814 A 10/2012

OTHER PUBLICATIONS

Liang, T., et al. "Equivalent-circuit modeling and verification of metal-ceramic packages for RF and microwave power transistors", IEEE Transactions on Microwave Theory and Techniques, vol. 47, No. 6, pp. 709-714 (Jun. 1999).

(Continued)

*Primary Examiner* — David S Blum (57) ABSTRACT

A system and method for a packaged device with harmonic control are presented. In one embodiment, a device includes a substrate and a transistor die coupled to the substrate. The transistor die includes a plurality of transistor cells. Each transistor cell in the plurality of transistor cells includes a control (e.g., gate) terminal. The device includes a second die coupled to the substrate. The second die includes a plurality of individual shunt capacitors coupled between the control terminals of the plurality of transistor cells and a ground reference node. The capacitance values of at least two of the shunt capacitors are significantly different.

15 Claims, 4 Drawing Sheets

(51) Int. Cl.
*H01L 21/48* (2006.01)
*H01L 21/50* (2006.01)
*H01L 23/66* (2006.01)
*H01L 23/64* (2006.01)
*H01L 23/00* (2006.01)
*H03F 1/56* (2006.01)
*H03F 3/195* (2006.01)
*H03F 1/02* (2006.01)
*H03F 3/60* (2006.01)

(52) U.S. Cl.
CPC .. *H03F 2200/222* (2013.01); *H03F 2200/267* (2013.01); *H03F 2200/451* (2013.01)

(56) References Cited

U.S. PATENT DOCUMENTS

| | | |
|---|---|---|
| 7,957,706 B2 | 6/2011 | Onno et al. |
| 8,076,994 B2 | 12/2011 | Farrell et al. |
| 2002/0067212 A1 | 6/2002 | Takenaka |
| 2007/0096340 A1 | 5/2007 | Piel et al. |
| 2008/0315392 A1 | 12/2008 | Farrell et al. |
| 2013/0106519 A1 | 5/2013 | Kamiyama et al. |
| 2015/0116040 A1 | 4/2015 | Miwa et al. |
| 2017/0085228 A1* | 3/2017 | Abdo ................ H01L 23/5223 |

OTHER PUBLICATIONS

Miwa, S., et al. "A 67% PAE, 100 W GaN Power Amplifier with On-Chip Harmonic Tuning Circuits for C-band Space Applications," 2001 IEEE MTT-S International Microwave Symposium, pp. 1-4 (Jun. 2011).

* cited by examiner

POWER TRANSISTOR WITH HARMONIC CONTROL

RELATED APPLICATION

This application claims priority to European patent application 16306079.1, filed on Aug. 24, 2016.

BACKGROUND

Field of Use

The present disclosure relates generally to power transistor devices, and more specifically, to power transistor devices including harmonic reducers for amplifier performance.

Description of the Related Art

Various electronic systems employ power amplifiers for increasing the power of signals, such as high frequency signals. In a wireless communication system, a power amplifier is usually the last amplifier in a transmission chain (i.e., the output stage). High gain, high linearity, stability, and a high level of efficiency—the ratio of radio frequency (RF) output power to direct current (DC) power—are characteristics of an ideal amplifier. Many factors can affect the linearity of a device in various power transistor applications, including changing capacitances with signal levels, breakdown and substrate conduction effects, class of operation, and changing transconductance with signal levels.

In the area of RF device design, an ideal transistor having a linear response will, under appropriate operating conditions, produce an output signal that is an exact replica of an input signal, amplified by a gain factor. In actual practice, however, the transistor produces unwanted signals including harmonics, half-frequency oscillations, intermodulation distortion, or some combination of the foregoing, resulting in an output signal that may differ significantly from the input signal. Filtering circuits may be implemented in the same dies as the transistor to reduce the unwanted signals. Such filtering is not always feasible or convenient, however, and can greatly increase the cost and complexity of RF amplifiers. A need therefore exists for an RF transistor that enables the power level of an unwanted signal to be reduced without significantly affecting the performance of the RF transistor within its intended range of operating frequencies.

BRIEF DESCRIPTION OF THE DRAWINGS

The present disclosure is illustrated by way of examples and embodiments and is not limited by the accompanying figures, in which like reference numbers indicate similar elements. For simplicity and clarity of illustration, the drawing figures illustrate the general manner of construction, and details of well-known features and techniques may be omitted to avoid unnecessarily obscuring the invention. Elements in the figures are illustrated for simplicity and clarity and have not been necessarily drawn to scale. In fact, the dimensions of some of the elements or regions in the figures may be exaggerated relative to other elements or regions to better understand embodiments of the apparatus. The figures together with the detailed description are incorporated and form part of the specification and serve to further illustrate examples, embodiments and the like, and explain various principles and advantages, in accordance with the present disclosure, where.

DETAILED DESCRIPTION

Embodiments of the present invention provide a power transistor device including a harmonic reducer made up of a number of capacitors in combination with a number of inductors. As described herein, the configuration of the harmonic reducer may improve the power transistor device's overall performance while simplifying the device's design and, potentially, reducing the overall cost of the device.

In the present power transistor device, a harmonic reducer is implemented within a packaged transistor device. The packaged transistor device includes an input matching circuit with the harmonic reducer, and a transistor die that includes a number of transistor cells. The harmonic reducer includes a plurality of shunt capacitors that are implemented in one or more separate components from the transistor die. In one embodiment, the harmonic reducer is implemented at least in part by a plurality of metal-oxide-silicon capacitors (MOSCAPs). In other embodiments, the harmonic reducer may be implemented using one or more integrated passive devices (IPDs). A shunt capacitor in the harmonic reducer is connected to each one of the transistor cells in the transistor die, or to a set of multiple transistor cells. In this arrangement, each shunt capacitor provides a fundamental matching function enabling the power transistor device to have a desired input impedance.

In contrast to conventional power transistor devices, in which the filtering capacitor of a conventional harmonic reducer can be incorporated directly into the semiconductor die within which the transistor cells of the transistor themselves are formed, in this configuration the shunt capacitors of the harmonic reducer are formed on one or more separate components. The separate component(s) is/are connected to the transistor die by a number of wire bonds (or other electronic connections). As described herein, this approach can simplify the power transistor device's design and may reduce overall manufacturing costs.

The present harmonic reducer includes a number of shunt capacitors, as mentioned above. The shunt capacitors are configured to filter out (e.g., send to ground) second order harmonic signals that may be present within an input signal to the present power transistor device. The individual shunt capacitors are also connected to the transistor cells of the packaged transistor (e.g., a shunt capacitor may be connected to each transistor cell).

In the present harmonic reducer configuration, the connections formed between each shunt capacitor in the harmonic reducer and the transistor cells of the packaged transistor may themselves modify the resonant frequencies of the transistor cells contained in the packaged transistor. This is because the wire bonds (or other electrical connections) connecting each shunt capacitor to each transistor cell can operate as inductive elements that become mutually coupled and change the transistor cell's resonant frequency. In turn, this can degrade the effectiveness of the filtering function provided by the harmonic reducer. As described herein, to mitigate these mutual coupling effects (which can, in turn, change the inductance of each wire bond connecting each shunt capacitor to a transistor cell), the individual capacitance of each shunt capacitor can be adjusted to compensate. Specifically, the capacitances of each shunt capacitor can be fine-tuned to offset the mutual inductance effect.

RF power transistor dies typically include a plurality of transistor cells operating in parallel. Transistors that can be included in packages according to embodiments of the invention can include laterally diffused metal oxide semiconductor field effect transistors (LDMOSFET) or other semiconductor devices, such as bipolar junction transistor (BJT) devices, metal semiconductor FET (MESFET) devices, V-groove MOS (VMOS) transistors, insulated-gate bipolar transistors (IGBTs), hererojunction bipolar transistors (HBTs), high electron mobility (HEMT) devices. The transistors can be made using narrow or wide bandgap semiconductors. For example, the transistors can include silicon LDMOS and/or bipolar transistors, and/or III-V devices such as GaAs MESFETs, InGaP HBTs, GaN HEMT devices, GaN bipolar transistors, etc.

Figure 1A:
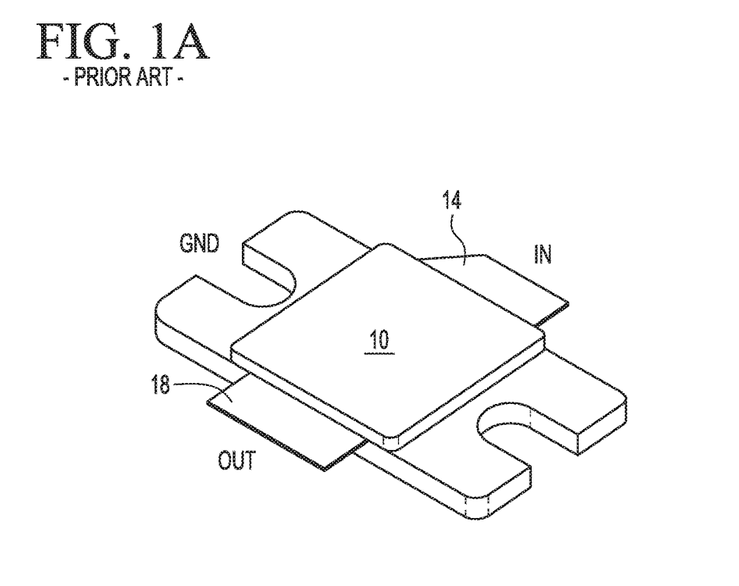
FIG. 1A depicts a conventional radio frequency power transistor package.
Figure 1B:
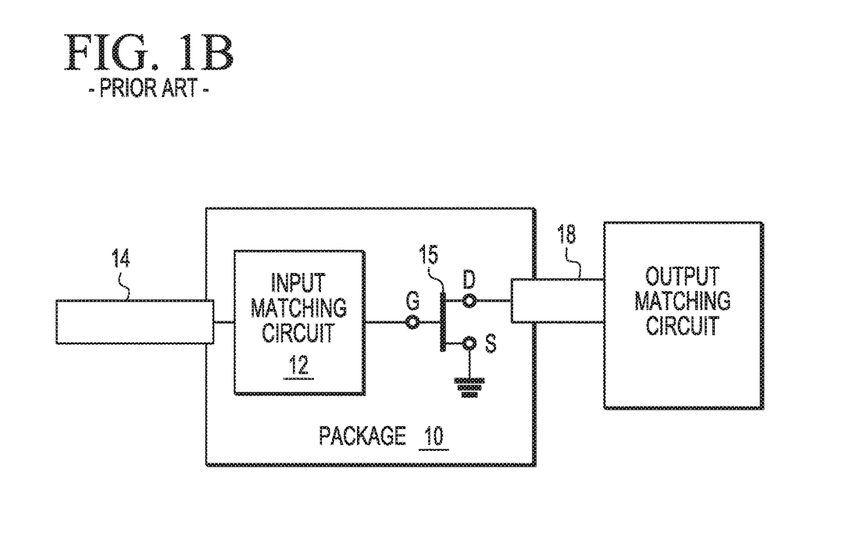
FIG. 1B depicts the conventional radio frequency power transistor package of FIG. 1A schematically.

RF power transistors may be packaged as discrete devices as illustrated by device 10 of FIG. 1A. FIG. 1B depicts the packaged device 10 of FIG. 1A schematically. Packaged device 10, which may include a field effect transistor (FET) or bipolar device, for example, normally includes input matching circuit 12 connecting RF signal input lead 14 to a control electrode of transistor 15 (e.g., a gate G of a FET or a base of a bipolar transistor). RF signal output lead 18 is connected to an output electrode of transistor 15 (e.g., the drain D of a FET or the collector or emitter of a bipolar transistor). RF signal input lead 14 and RF signal output lead 18 extend outside device 10, as shown in FIG. 1A to facilitate connection to external system components. The source S of FET 15 may be grounded.

Device 10 may be mounted on a printed circuit board (not shown). An external output matching circuit 22 may also be mounted on the printed circuit board. Alternatively, all or portions of the output matching circuit 22 may be implemented within the packaged device 10 between the transistor 15 and the output lead 18. A bias/RF diplexer (not shown) may be connected to the external output matching circuit to connect output lead 18 to an RF output. Furthermore, a DC power supply (not shown) may be connected to the transistor output lead 18.

If device 10 operated ideally, device 10 would have a perfectly linear response enabling device 10 to produce an output signal that is an exact replica of an input signal, amplified by a gain factor. In actual practice, however, device 10 (and, specifically, transistor 15 of device 10) produces unwanted signals including harmonic signals of the fundamental or resonant frequency of the transistor 15. To reduce or mitigate these harmonic signals, some devices include harmonic reducers or harmonic traps configured to filter harmonic signals from the input or output of transistor 15 and send those signals directly to ground so that the signals do not appear in the output signal of the device 10.

Sometimes, a harmonic reducer is incorporated into the package of device 10 so that harmonic reduction occurs before the signal passing through the device 10 reaches the RF signal output lead 18. This approach can reduce second and/or higher order harmonics within the device package itself. In conventional devices, however, this generally means that the harmonic reducer is fabricated within the same die as the transistor device itself. In other implementations, harmonic reducers can be installed at the output of a packaged transistor. In such a device, the harmonic reducer is generally configured to reduce the energy in an output signal that is at a harmonic frequency of the packaged transistors fundamental or resonant frequency, such as the second harmonic frequency.

Figure 2:
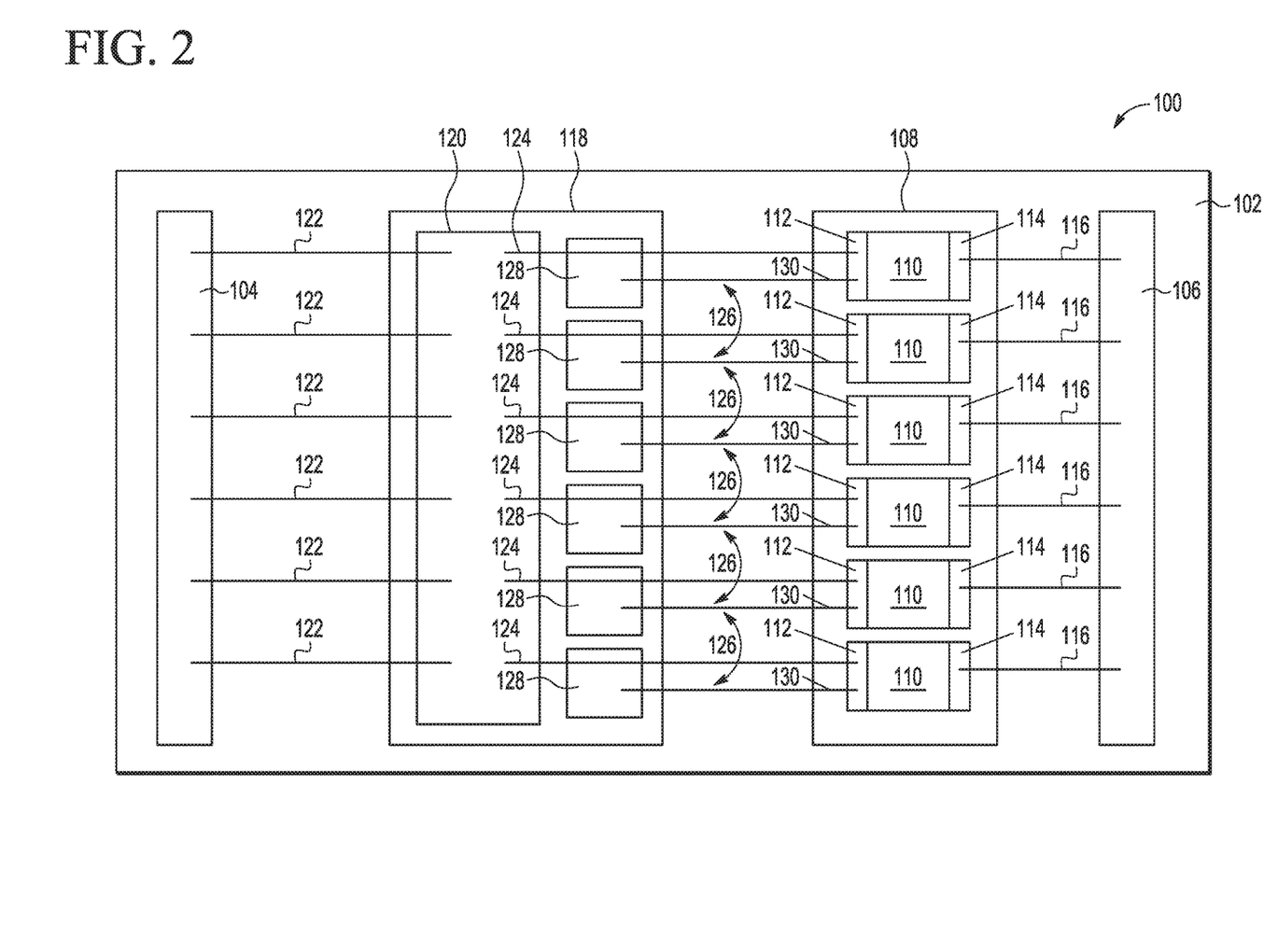
FIG. 2 is a block diagram depicting the present power transistor device.

In the present disclosure, a power transistor device is provided in which a harmonic reducer is implemented in a component that is separate from the device's transistor die. This simplifies the fabrication process for the power transistor die, making it easier to manufacture a power transistor die for a given implementation. FIG. 2 is a block diagram illustrating an embodiment of a power transistor device 100.

Power transistor device 100 includes substrate 102 to which the components of power transistor device 100 are mounted or otherwise connected or attached. Substrate 102 may include a printed circuit board (PCB) a conductive flange or any other suitable substrate for supporting the components of power transistor device 100.

Input terminal 104 and output terminal 106 are mounted to substrate 102. Input terminal 104 is configured to receive an input signal from an external system component. In various embodiments, the input signal may be an RF signal to be amplified by power transistor device 100. After the input signal has been amplified by power transistor device 100, the amplified signal is outputted at output terminal 106. External system components configured to receive the amplified signal may be connected to output terminal 106.

Input terminal 104 and output terminal 106 include a conductive material such as Nickel/Gold (Ni/Au). In other embodiments, input terminal 104 and output terminal 106 may include other metals and/or combinations of metals, such as Aluminum (Al), Copper (Cu), Tin (Sn), or Silver (Ag) and/or other conductive materials such as graphene, conducting polymer materials, conducting organic materials, carbon nanotube sheets (with or without doping), and other suitable conductive materials. Input terminal 104 and output terminal 106 may be shaped by any suitable fabrication processes including deposition and patterning.

Transistor die 108 is mounted to substrate 102. Transistor die 108 includes a number of different transistor cells 110. Each transistor cell 110 includes a number of different terminals. By supplying electrical energy to (e.g., applying a voltage across) the various terminals of transistor cells 110, a current flow through each transistor cell 110 can be controlled. Specifically, each transistor cell 110 includes a control terminal and first and second current-carrying terminals. If the transistor cell is configured as a FET, the control terminal is referred to as a gate terminal, and the first and second current-carrying terminals are referred to as source and drain terminals. For bipolar junction transistors (BJTs), the control terminal is referred to as the base terminal, and the first and second current-carrying terminals are referred to as collector and emitter terminals. When the transistor is connected to a power supply—for a FET this involves putting a voltage across the transistors source and drain terminals, and for a BJT this involves putting a voltage across the transistors collector and emitter terminals—the voltage at the transistor's control terminal will determine a current flow through the transistor. It is this attribute of transistor cells 110 that enables them to operate to amplify an input signal. By supplying a relatively low magnitude input signal to the control terminals of the transistors, that relatively low magnitude signal can control the flow of a higher-magnitude signal though the transistor.

In power transistor devices, such as those used to amplify relatively high-power and high-frequency signals, a single transistor may not be able to generate the amplified signals. As such, those devices may include multiple transistor cells operating in parallel to process high-power signals.

As such, transistor die 108 includes a number of different transistor cells 110 arranged in parallel. Each transistor cell 110 includes a control terminal 112. Each transistor cell 110 also includes an output terminal 114 at which the signal generated by the transistor cell 110 is outputted. If transistor cells 110 are FET devices, output terminals 114 may be a source or drain terminal, depending upon the implementation of power transistor device 100. If transistor cells 110 are BJTs, for example, output terminals 114 may be a collector or emitter terminal, depending upon the implementation of power transistor device 100.

Output terminals 114 of transistor cells 110 are connected to output terminal 106 by any suitable conductive connection. In this example, output terminals 114 are connected to output terminal 106 by a number of wire bonds 116. Wire bonds 116 may be connected directly to output terminals 114 and output terminal 106, or may be connected to those elements via one or more solder bumps that are first deposited on each of output terminals 114 and output terminal 106. In other embodiments, however, any suitable approach may be used for electrically interconnecting output terminals 114 and output terminal 106.

In one embodiment, transistor die 108 may be formed using suitable semiconductor fabrication processes and materials. For example, transistor die 108 may be implemented using gallium nitride (GaN)-based materials, silicon-based materials, or other types of semiconducting materials. Similarly, transistor die 108 and, specifically, transistor cells 110 making up transistor die 108, may be configured in a manner suitable for desired application of the power transistor device 100. As indicated above, transistor cells 110, for example, may form portions of various types of transistors, including LDMOSFETs, BJT devices, MESFET devices, VMOS transistors, IGBTs, HBTs, HEMT devices, and the like.

Power transistor device 100 includes filter circuit 118. Filter circuit 118 may be implemented as an integrated passive device (IPD) die that is mounted to substrate 102 and which includes at least some of the components of a harmonic reducer. As illustrated in FIG. 2, filter circuit 118 and transistor die 108 are separate and distinct components or dies.

Filter circuit 118 includes primary capacitor 120, in an embodiment. Primary capacitor 120 is electrically coupled to input terminal 104 by wire bonds 122, though in other embodiments other approaches for electrically interconnecting primary capacitor 120 and input terminal 104 may be utilized. Primary capacitor 120 is also electrically coupled to control terminals 112 of transistor cells 110 by wire bonds 124, though in other embodiments other approaches for electrically interconnecting primary capacitor 120 and control terminals 112 of transistor cells 110 may be utilized.

A first terminal or plate (as shown in FIG. 2) of primary capacitor 120 is electrically coupled to input terminal 104 and control terminals 112 of transistor cells 110, while a second terminal or plate (not shown in FIG. 2) of primary capacitor 120 is electrically coupled to a ground reference node or terminal (e.g., the conductive top surface of substrate 102). In such a configuration, primary capacitor 120 in combination with wire bonds 124 form a filter network (e.g., an L-C filter network). By selecting an appropriate capacitance of primary capacitor 120, taking into consideration the inductance of wire bonds 124, primary capacitor 120 can operate as a fundamental frequency (F0) input matching network for signals inputted into power transistor device 100 at input terminal 104. For example, fundamental frequency matching (or input impedance matching) is achieved by selecting an appropriate capacitance value for primary capacitor 120 and an appropriate inductance (e.g., length) for wire bonds 124. Generally, the capacitance of primary capacitor 120 and the inductance of wire bonds 124 are selected to set the input impedance of power transistor device 100 to a suitable or desired level.

The capacitance of primary capacitor 120 (taking into consideration the inductance of wire bonds 124) can be selected or tuned based on the desired power level and frequency of operation for power transistor device 100. As the desired power level and frequency of operation changes for a particular application, the capacitance of primary capacitor 120 in a particular power transistor device 100 can be adjusted in compensation.

If primary capacitor 120 were to be implemented within the same integrated circuit die as transistor cells 110, any changes to the desired power level and frequency of operation for the power transistor device 100 would require that the entire die containing both transistor cells 110 and primary capacitor 120 be redesigned. Such redesign can be costly and inefficient.

In the present design, as illustrated in FIG. 2, primary capacitor 120 and transistor cells 110 are implemented in separate components or dies. This enables a single transistor die 108 to be used with many different filter circuits 118 having different primary capacitors 120 with different capacitances. Accordingly, many different power transistor devices 100 suited for various power levels and frequencies of operation can be manufactured using the same design (i.e., die) for transistor die 108 in combination with different filter circuits 118. Because it can be simpler and less expensive to change the capacitance of primary capacitor 120 when primary capacitor 120 is located in a separate component (and not located on the same die as transistor cells 110), this can simplify the manufacturing process and reduce the cost of power transistor device 100.

Filter circuit 118 also includes a number of shunt capacitors 128 (e.g., a number between two and thirty or more). Each shunt capacitor 128 is electrically coupled to a control terminal 112 of at least one transistor cell 110 by one or more wire bonds 130. Essentially, a series resonant circuit between the control terminal 112 and the ground reference node is formed by a set of wire bonds 130 coupled in series with a shunt capacitor 128. In other words, the device 100 includes a plurality of series resonant circuits coupled between the control terminals 112 and the ground reference node, where each series resonant circuit is formed from one or more wire bonds 130 coupled to a first terminal of a shunt capacitor 128, where the second terminal of the shunt capacitor 128 is coupled to the ground reference node. The shunt capacitors 128 and the series coupled wire bonds 130 can operate to filter second order harmonic signals that may be present within an input signal to the present power transistor device provided at input terminal 104. By selecting desired capacitances of shunt capacitors 128 and, optionally, modifying lengths of wire bonds 130, for example, second order harmonic frequencies (or other harmonic frequencies) of the resonant frequencies of transistor cells 110 in the input signal can be sent to ground rather than propagated through transistor die 108. This will, in turn, reduce the magnitude of those harmonic signals at input terminal 112 of power transistor device 100. Although in FIG. 2 a single shunt capacitor 128 is illustrated as being connected to each transistor cell 110, it should be understood that in alternative embodiments, a single shunt capacitor 128 may be coupled to the gates (or other control terminals) of more than one transistor cell 110, and/or multiple wire bonds may couple a single shunt capacitor 128 to a single transistor cell 110 or one or more transistor cells 110.

During operation of power transistor device 100, however, sets of wire bonds 130 connecting each shunt capacitor 128 to a set of one or more of the transistor cells 110 can become inductively coupled. In some cases the mutual inductance effects (see arrows 126) between each of the sets of wire bonds 130 can modify the second harmonic resonant frequency between each of transistor cells 110. As a result, each individual transistor cell 110 in transistor die 108 may not observe the same harmonic impedance, which can, in turn reduce the effectiveness of shunt capacitors 128 as second order harmonic filters. To offset or reduce the detrimental effects that may result from mutual inductance between wire bonds 130, the capacitance values of each shunt capacitor 128 can be adjusted or modified to offset or reduce those effects. In other words, according to an embodiment, the capacitance values of shunt capacitors 128 may be significantly different from each other. According to an embodiment, for example, the capacitance values of at least two of the shunt capacitors 128 (e.g., two adjacent or non-adjacent shunt capacitors 128) are at least 5 to 10 percent different from each other. For example, the shunt capacitors 128 may have values in the picofarad (pF) range, such as values between 1.0 pF and 2.0 pF. In such an embodiment, one of the shunt capacitors 128 may have a value of 1.43 pF, another may have a value of 1.18 pF, yet another may have a value of 1.38 pF, and so on. In other embodiments, the capacitors 128 may have values in a different range of capacitance values. Considered another way, according to an embodiment, at least two of the series resonant circuits resonate at resonant frequencies that are significantly different from each other. According to an embodiment, for example, the resonant frequencies of at least two of the series resonant circuits are significantly different from each other when they vary by at least 5 to 10 percent Generally, the capacitance values of shunt capacitors 128 are selected to adjust the impedance harmonic of each transistor cell 110 (or set of cells 110) to neutralize or at least partially offset the effects of mutual inductance between wire bonds 130 connecting each shunt capacitor 128 to each transistor cell 110 (or set of cells 110). In some cases, the capacitance values for each of shunt capacitors 128 can be selected by simulating the desired power transistor device 100. Based upon the result of those simulations, individual capacitance values for shunt capacitors 128 can be selected that normalize the resonant frequency of each transistor cell 110 about the desired resonant frequency. In some cases, this may mean that the capacitance values of each of the shunt capacitors 128 are different from one another. In other cases, two or more of the shunt capacitors 128 may share the same capacitance value. At least some of the capacitance values of the shunt capacitors 128 are different from each other, in various embodiments.

Generally, in a given application, the algorithm for calculating the desired capacitance value for each shunt capacitor 128 can be based upon a multi-port simulation. The simulation can determine frequency resonance at the second order harmonic frequency of each transistor cell 110. The resonant frequency at the second order harmonic frequency for each transistor cell 110 is determined by the L-C network formed by the connected shunt capacitor 128. Specifically, the capacitance of the L-C network is determined by the connected shunt capacitor 128. The inductance of the L-C network is determined by the inductance of the connected wire bond 130, as well as the other wire bonds 130 coupled to the other shunt capacitors 128 (i.e., the wire bonds 130 that may mutually interfere with the connected wire bond 130). The amount of mutual inductance will be determined by the distance between the connected wire bond 130 and each of the nearby or adjacent wire bonds 130. The L-C network can then be simulated, enabling a suitable capacitance values for each shunt capacitor 128 to be identified to achieve the desired second order harmonic filtering capability for each transistor cell 110.

As illustrated, in FIG. 2, filter circuit 118 is connected to an input side of transistor die 108, with both primary capacitor 120 and each shunt capacitor 128 being connected to an input or control terminal 112 of each transistor cell 110 by a one or more wire bonds. In other embodiments, however, filter circuit 118 could instead be connected at the output of transistor die 108. In such an arrangement, both the primary capacitor and each shunt capacitor would be connected to output terminals 114 (e.g., the drain terminals) of each transistor cell 110 by a number of wire bonds.

In the present disclosure, the capacitors of filter circuit 118 are implemented as portions of an IPD that includes a plurality of MOSCAPs or metal-insulator-semiconductor capacitors. Such a construction enables filter circuit 118 to be manufactured with tight tolerances for the capacitance values of primary capacitor 120 and shunt capacitors 128. For example, primary capacitor 120 may be implemented as a single MOSCAP in the IPD, and each of shunt capacitors 128 can be implemented as an additional MOSCAP in the IPD. In other embodiments, however, primary capacitor 120 and shunt capacitors 128 may be implemented in any number of separate IPDs that may be separately mounted to substrate 102 and connected to the other components of power transistor device 100.

Figure 3:
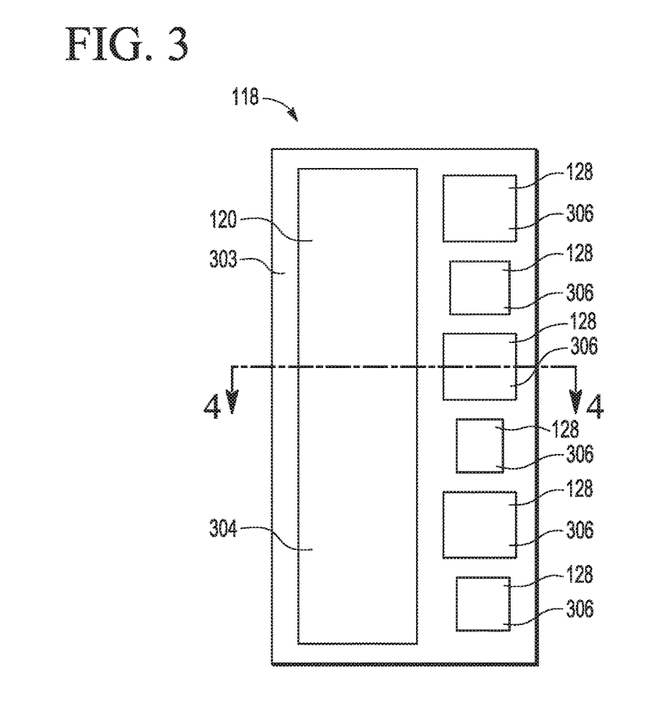
FIG. 3 depicts a top view of a metal-oxide-silicon capacitor implementing the filter package depicted in FIG. 2.
Figure 4A:
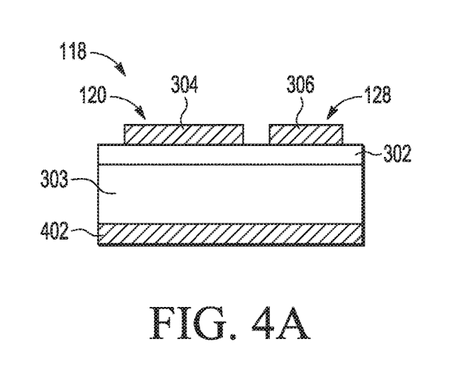
FIG. 4A is a cross-sectional view of the filter package depicted in FIG. 3 taken along line 4-4.

FIGS. 3 and 4 show additional detail of filter circuit 118 implemented as an IPD that includes a MOSCAP structure. FIG. 3 is a top view of filter circuit IPD 118, while FIG. 4A is a cross-sectional view of filter circuit IPD 118 taken along line 4-4 of FIG. 3. Filter circuit IPD 118 includes insulating layer 302 including an electrically insulating material. In various embodiments, layer 302 may include oxides or other electrically insulating materials, such as silicon dioxide ($SiO_2$) or aluminum oxide ($Al_2O_3$). In other embodiments, insulating layer 302 may include barium oxide/tellurium oxide (BaO—$TeO_2$), indium tin oxide (InSnO), cerium oxide (CeO), nickel oxide (NiO), niobium oxide (NbO) (including niobium dioxide, and niobium pentoxide), tin oxide (SnO), tantalum oxide ($Ta_2O_5$), tungsten oxide (WO), zinc oxide (ZnO), chromium oxide (CrO), manganese oxide ($MnO_2$), titanium oxide ($TiO_2$), zirconium oxide (ZrO), boron bismuth oxide (BBiO), indium tin oxide (ITO), fluorine doped tin oxide (FTO), aluminum doped zinc oxide (AZO), indium-doped cadmium-oxide, or other doped metal oxides.

Layer 302 has a thickness. As described below, the thickness of layer 302 at least partially determines the capacitances of primary capacitor 120 as well as the capacitances of each of shunt capacitors 128.

Layer 302 is formed over substrate 303. Substrate 303 forms the body of filter circuit 118 and may include a suitable semi-conducting material, such as a doped silicon material, GaAs, or any other materials that may be incorporated into the body of a MOSCAP structure.

Conductive layer 402 is formed over a back surface of filter circuit IPD 118 on substrate 303. Conductive layer 402 includes a conductive material such as Ni/Au, Al, Cu, Sn, or Ag and/or other conductive materials such as graphene, conducting polymer materials, conducting organic materials, carbon nanotube sheets (with or without doping), and other suitable conductive materials. Conductive layer 402 is connected to a ground terminal (not shown), enabling the capacitors of conductive layer 402 to operate as filters or harmonic reducers, as described herein.

Primary capacitor 120 includes a first plate 304 formed over a top surface of insulating layer 302. First plate 304 includes a conductive material such as Ni/Au, Al, Cu, Sn, or Ag and/or other conductive materials or combinations of conductive materials. Generally, the structure of primary capacitor 120 is made up of first plate 304, a portion of insulation layer 302 underlaying first plate 304, a portion of substrate 303 underlaying first plate 304, and conductive layer 402. In this arrangement, the capacitance of primary capacitor 120 is at least partially determined by the geometry of first plate 304, insulating layer 302, substrate 303, and conductive layer 402.

Accordingly, by adjusting the size (e.g., the area, as defined by the length and width in the top view of FIG. 3) of first plate 304 and the thickness of insulating layer 302, the capacitance of the primary capacitor 120 ($C_{primary}$) can be adjusted as needed. In other embodiments, however, the capacitance of primary capacitor 120 may be adjusted, for example, by changing the material (and, specifically, the dielectric constant) of insulating layer 302 or substrate 303.

Each shunt capacitor 128 includes a first plate 306 formed over a top surface of insulating layer 302. First plate 306 includes a conductive material such as Ni/Au, Al, Cu, Sn, or Ag and/or other conductive materials or combinations of conductive materials. Generally, the structure of each shunt capacitor 128 is made up of the first plate 306 of the shunt capacitor 128, a portion of insulation layer 302 underlaying first plate 304, and a portion of conductive layer 402 that overlaps the area of the first plate 306. In this arrangement, the capacitance of each shunt capacitor 128 is at least partially determined by the geometry of first plate 306, insulating layer 302, substrate 303, and conductive layer 402.

Accordingly, by adjusting the size of first plate 306 (as illustrated in FIG. 3) and the thickness of insulating layer 302 and substrate 303, the capacitance of each shunt capacitor 128 ($C_{shunt}$) can be adjusted as needed. According to an embodiment, different capacitances for the shunt capacitors 128 are achieved by forming first plates 306 of different areas. In other embodiments, however, the capacitance of each shunt capacitor 128 may be adjusted, for example, by changing the material (and, specifically, the dielectric constant) of insulating layer 302 or substrate 303.

Although in FIGS. 3 and 4, primary capacitor 120 is shown formed in the same IPD or die as each shunt capacitor 128, in other embodiments, primary capacitor 120 and shunt capacitors 128 may be formed on separate IPDs that are each individually mounted to a substrate (e.g., substrate 102) and incorporated into the present power transistor device.

Figure 4B:
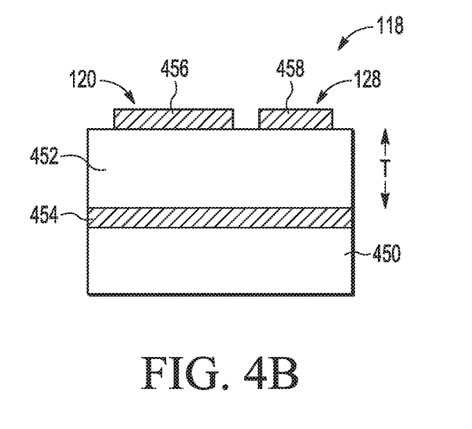
FIG. 4B is a cross-section view of an alternative implementation of a filter package.

FIG. 4B depicts a cross-sectional view of an alternative embodiment of filter package 118 implemented as an IPD. As shown in FIG. 4B, filter circuit IPD 118 is formed over substrate 450. Substrate 450 includes a suitable semiconducting material such as a doped silicon or GaAs. Filter circuit IPD 118 includes insulating layer 452 including an electrically insulating material. In various embodiments, layer 452 may include oxides or other electrically insulating materials, such as SiO2 or Al2O3. In other embodiments, insulating layer 452 may include BaO—TeO2, InSnO, CeO, NiO, NbO (including niobium dioxide, and niobium pentoxide), SnO, Ta2O5, WO, ZnO, CrO, MnO2, TiO2, ZrO, BBiO, ITO, FTO, AZO, indium-doped cadmium-oxide, or other doped metal oxides.

Layer 452 has a thickness T. As described below, the thickness of layer 452 at least partially determines the capacitances of primary capacitor 120 as well as the capacitances of each of shunt capacitors 128.

Conductive layer 454 is formed over substrate 450 between substrate 450 and insulating layer 452. Conductive layer 454 includes a conductive material such as Ni/Au, Al, Cu, Sn, or Ag and/or other conductive materials such as graphene, conducting polymer materials, conducting organic materials, carbon nanotube sheets (with or without doping), and other suitable conductive materials. Conductive layer 454 is connected to a ground terminal (not shown), enabling the capacitors of conductive layer 454 to operate as filters or harmonic reducers, as described herein.

Primary capacitor 120 includes a first plate 456 formed over a top surface of insulating layer 452. First plate 456 includes a conductive material such as Ni/Au, Al, Cu, Sn, or Ag and/or other conductive materials or combinations of conductive materials. Generally, the structure of primary capacitor 120 is made up of first plate 456, a portion of insulation layer 452 underlaying first plate 456, and conductive layer 454. In this arrangement, the capacitance of primary capacitor 120 is at least partially determined by the geometry of first plate 456, insulating layer 452, and conductive layer 454. Specifically, the capacitance of primary capacitor 120 is determined by Equation 1, below:

$$C_{primary} = \varepsilon_0 * \varepsilon_r * (S_{primary}/T) \qquad \text{Equation 1}$$

In Equation 1, $\varepsilon_0$ is the permittivity of free space, $\varepsilon_r$ is the permittivity of insulating layer 452, $S_{primary}$ is the area of first plate 456 of primary capacitor 120, and T is the thickness of insulating layer 452.

Accordingly, by adjusting the size (e.g., the area, as defined by the length and width) of first plate 456 and the thickness of insulating layer 452, the capacitance of the primary capacitor 120 ($C_{primary}$) can be adjusted as needed. In other embodiments, however, the capacitance of primary capacitor 120 may be adjusted, for example, by changing the material (and, specifically, the dielectric constant) of insulating layer 452.

Each shunt capacitor 128 includes a first plate 458 formed over a top surface of insulating layer 452. First plate 458 includes a conductive material such as Ni/Au, Al, Cu, Sn, or Ag and/or other conductive materials or combinations of conductive materials. Generally, the structure of each shunt capacitor 128 is made up of the first plate 458 of the shunt capacitor 128, a portion of insulation layer 452 underlaying first plate 458, and a portion of conductive layer 454 that overlaps the area of the first plate 458. In this arrangement, the capacitance of each shunt capacitor 128 is at least partially determined by the geometry of first plate 458, insulating layer 452, and conductive layer 454. Specifically, the capacitance of each shunt capacitor 128 is determined by Equation 2, below:

$$C_{shunt} = \varepsilon_0 * \varepsilon_r * (S_{shunt}/T) \qquad \text{Equation 2}$$

In Equation 2, $\varepsilon_0$ is the permittivity of free space, $\varepsilon_r$ is the permittivity of insulating layer 452, $S_{shunt}$ is the area of first plate 458 of the shunt capacitor 128, and T is the thickness of insulating layer 452.

Accordingly, by adjusting the size of first plate 458 and the thickness of insulating layer 452, the capacitance of each shunt capacitor 128 ($C_{shunt}$) can be adjusted as needed. According to an embodiment, different capacitances for the shunt capacitors 128 are achieved by forming first plates 458 of different areas. In other embodiments, however, the capacitance of each shunt capacitor 128 may be adjusted, for example, by changing the material (and, specifically, the dielectric constant) of insulating layer 452.

Figure 5:
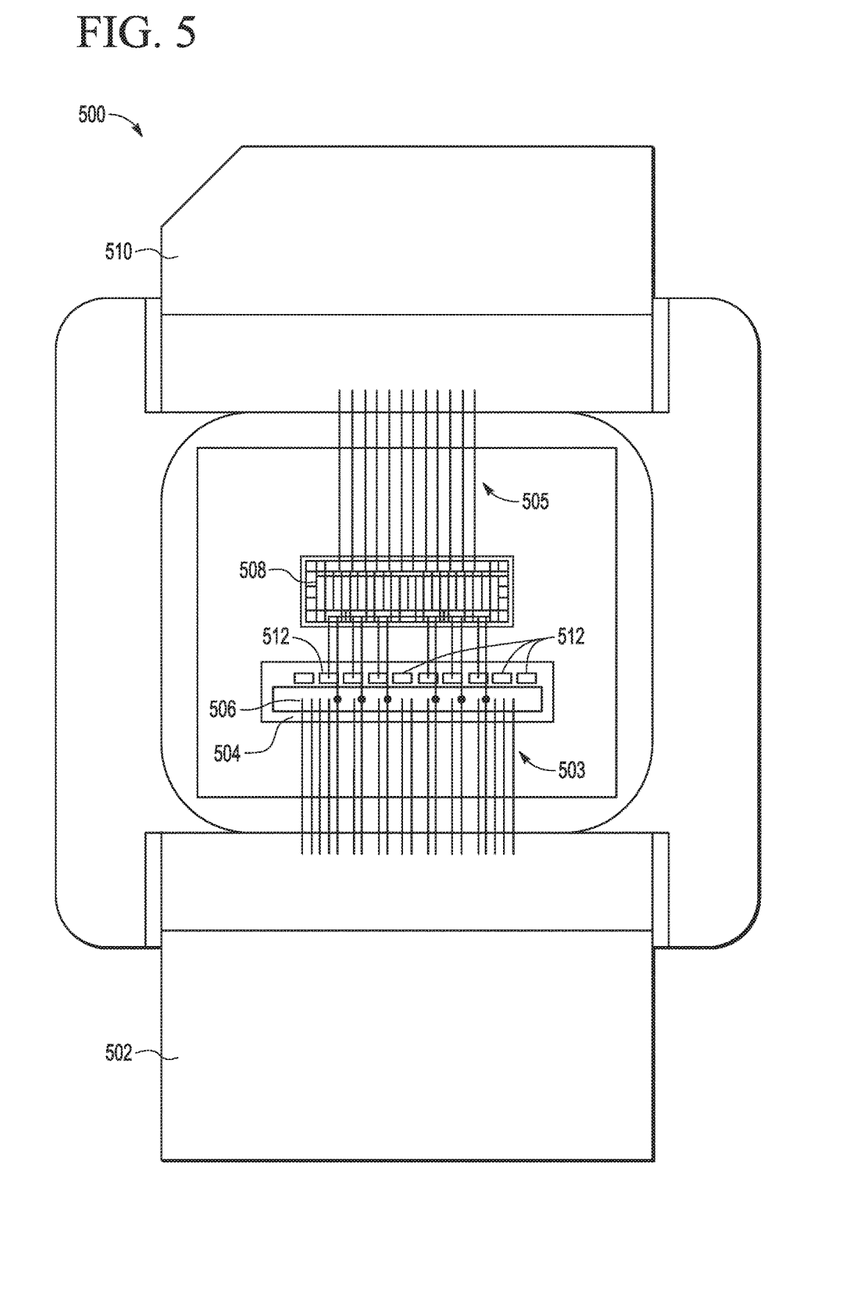
FIG. 5 is a top view depicting a package layout of the present power transistor device.

FIG. 5 is a top view depicting a package layout of an embodiment of a power transistor device. Package 500 includes an input terminal 502 (or input lead) configured to be connected to an external circuit (not shown) for supplying an input RF signal. Input terminal 502 ultimately connects to the control terminals of the transistor cells of package 500. If the transistor cells are implemented as FETs, the control terminals can be referred to as gate terminals. Accordingly, input terminal 502 may sometimes be referred to as a gate terminal for package 500.

Input terminal 502 is electrically coupled to the filter circuit IPD 504 by a number of wire bonds 503. Specifically, input terminal 502 is connected to primary capacitor 506 of the filter circuit IPD 504. As discussed above, primary capacitor 506 is configured to filter harmonic signals out of the input signal received from input terminal 502.

Primary capacitor 506 is connected to the control terminals of transistor cells in packaged transistor 508 by additional wire bonds. One of the current-carrying terminals (e.g., the drain or source) of the transistor cells in packaged transistor 508 are, in turn, connected to output terminal 510 (or output lead) of package 500 by additional wire bonds 505. If the transistor cells of packaged transistor 508 are implemented as FETs, the drain terminals of the transistor cells may be connected to output terminal 510. As such, output terminal 510 may sometimes be referred to as the drain terminal of package 500.

Filter circuit IPD 504 also includes a number of individual shunt capacitors 512. Each shunt capacitor 512 is connected by one or more wire bonds to one of the transistor cells in packaged transistor 508. As described above, shunt capacitors 512 operate to offset or reduce the effects of mutual impedance between the wire bonds connecting the shunt capacitors 512 to the control terminals of the transistor cells of transistor die 508.

A packaged RF power transistor according to embodiments of the invention may be useful in a wide range of applications in which linearity is important. For example, a packaged power transistor according to embodiments of the invention may have application in systems, such as WiMAX, WCDMA, CDMA, and/or other systems, including future (4th generation) systems. In general, embodiments of the invention may be useful in any application in which linear performance is desired from a power transistor.

For the sake of brevity, conventional techniques relating to high-power amplifiers, such as Doherty amplifiers, load modulation, impedance matching, integrated circuit design or fabrication, transistor design or fabrication, and other functional aspects of the systems (and the individual operating components of the systems) may not be described in detail herein. Furthermore, the connecting lines shown in the various figures contained herein are intended to represent exemplary functional relationships or physical couplings between the various elements. It should be noted that many alternative or additional functional relationships or physical connections may be present in an embodiment of the subject matter. In addition, certain terminology may also be used herein for the purpose of reference only, and thus are not intended to be limiting.

As used herein, the term "semiconductor" is intended to include any semiconductor whether single crystal, polycrystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures as for example and not intended to be limiting, semiconductor-on-insulator (SOI) structures, and combinations thereof. For convenience of explanation and not intended to be limiting, semiconductor devices and methods of fabrication are described herein for silicon semiconductors but persons of skill in the art will understand that other semiconductor materials may also be used.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Reference herein to directional relationships, such as top and bottom or left and right, refer to the relationship of the components in the orientation illustrated in the drawings, which may not be the orientation of the components in all uses of the apparatus being described. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "substantial" and "substantially" herein mean sufficient to accomplish the stated purpose in a practical manner and that minor imperfections, if any, are not significant for the stated purpose.

In conclusion, systems, devices, and methods configured in accordance with example embodiments of the invention relate to:

A device including a substrate and a transistor die coupled to the substrate. The transistor die including a transistor formed from a plurality of transistor cells. Each transistor cell in the plurality of transistor cells includes a control terminal. The device includes a second die coupled to the substrate. The second die includes a plurality of shunt capacitors. Each shunt capacitor in the plurality of shunt capacitors is electrically coupled to the control terminal of a different transistor cell in the plurality of transistor cells. At least two shunt capacitors of the plurality of shunt capacitors have capacitance values that are significantly different from each other.

According to an example, each one of the plurality of shunt capacitors is connected to the control terminal of one of the plurality of transistor cells by one or more wire bonds.

According to an example, the plurality of shunt capacitors are configured to offset variations in resonant frequencies of the plurality of transistor cells resulting from mutual inductances between at least a first set of one or more wire bonds connecting a first shunt capacitor to a first control terminal of a first transistor cell and a second set of one or more wire bonds connecting a second shunt capacitor to a second control terminal of a second transistor cell.

According to an example, the second die further comprises a primary capacitor connected to the control terminal of each transistor cell in the plurality of transistor cells. The primary capacitor is configured to at least partially determine an input impedance of the device.

According to an example, each transistor cell in the plurality of transistor cells is connected to the primary capacitor in parallel.

According to an example, the transistor is formed on a substrate selected from a silicon substrate, a gallium nitride substrate, a gallium arsenide substrate, and an indium gallium phosphide substrate.

According to an example, the plurality of shunt capacitors are configured to filter second order harmonic signals from an input signal to the device.

According to an example, each of the shunt capacitors is a metal-oxide-silicon capacitor (MOSCAP).

A packaged device includes a substrate having a ground reference node and a semiconductor die on the substrate. The semiconductor die includes a plurality of transistor cells. The packaged device includes a plurality of series resonant circuits. Each series resonant circuit is coupled between one of the plurality of transistor cells and the ground reference node. Each series resonant circuit includes a set of one or more wire bonds in series with a shunt capacitor. At least two of the series resonant circuits resonate at resonant frequencies that are significantly different from each other.

According to an example, each of the shunt capacitors is a metal-oxide-silicon capacitor (MOSCAP) formed on a second substrate.

According to an example, capacitance values of two adjacent shunt capacitors are significantly different, and wherein the capacitance values of the two adjacent shunt capacitors are selected to compensate for an offset variation in resonant frequencies of two adjacent transistor cells to which the two adjacent capacitors are coupled, wherein the offset variation results from mutual inductances between the sets of wire bonds in the two resonant circuits to which the two adjacent transistor cells are coupled.

According to an example, the transistor is formed on a substrate selected from a silicon substrate, a gallium nitride substrate, a gallium arsenide substrate, and an indium gallium phosphide substrate.

According to an example, the plurality of series resonant circuits is configured to filter second order harmonic signals from an input signal to the packaged device.

According to an example, the package further includes an integrated passive device (IPD) on the substrate. The IPD includes the shunt capacitors of the plurality of series resonant circuits.

According to an example, the packaged further comprises a primary capacitor coupled to a control terminal of each one of the plurality of transistor cells, and wherein each one of the shunt capacitors also is coupled to a control terminal of each one of the plurality of transistor cells.

A method including coupling a semiconductor die to a substrate. The semiconductor die includes a plurality of transistor cells. The method includes electrically connecting a shunt capacitor of a plurality of shunt capacitors to each one of the plurality of transistor cells. At least two shunt capacitors of the plurality of shunt capacitors have capacitance values that are significantly different from each other.

According to an example, the method further includes coupling a second die to the substrate, wherein the second die includes a primary capacitor and the plurality of shunt capacitors.

According to an example, the method further includes connecting a plurality of wire bonds between the plurality of shunt capacitors and the plurality of transistor cells. The shunt capacitors are configured to offset variations in a resonant frequency of each transistor cell in the plurality of transistor cells resulting from mutual inductances between at least two sets of the plurality of wire bonds.

According to an example, the method further includes coupling an integrated passive device (IPD) to the substrate. The IPD includes the plurality of shunt capacitors, wherein each of the shunt capacitors is a metal-oxide semiconductor capacitor (MOSCAP).

According to an example, the coupling the plurality of shunt capacitors to each one of the plurality of transistor cells includes coupling one of the plurality of shunt capacitors to a control terminal of each transistor cell.

The foregoing description was primarily directed to preferred embodiments of the invention. Although some attention was given to various alternatives within the scope of the invention, it is anticipated that one skilled in the art will likely realize additional alternatives that are now apparent from disclosure of embodiments of the invention. Accordingly, the scope of the invention should be determined from the following claims and not limited by the above disclosure.

The invention claimed is:

1. A device, comprising:
    a substrate;
    a transistor die coupled to the substrate, the transistor die including a transistor formed from a plurality of transistor cells, each transistor cell in the plurality of transistor cells including a control terminal; and
    a second die coupled to the substrate, the second die including:
        a plurality of shunt capacitors, each shunt capacitor in the plurality of shunt capacitors being electrically coupled to the control terminal of a different transistor cell in the plurality of transistor cells, a first shunt capacitor in the plurality of shunt capacitors has a first capacitance value, a second shunt capacitor in the plurality of shunt capacitors has a second capacitance value, and the second capacitance value is at least 5% greater than the first capacitance value.

2. The device of claim 1, wherein each one of the plurality of shunt capacitors is connected to the control terminal of one of the plurality of transistor cells by one or more wire bonds.

3. The device of claim 2, wherein the plurality of shunt capacitors are configured to offset variations in resonant frequencies of the plurality of transistor cells resulting from mutual inductances between at least a first set of one or more wire bonds connecting a first shunt capacitor to a first control terminal of a first transistor cell and a second set of one or more wire bonds connecting a second shunt capacitor to a second control terminal of a second transistor cell.

4. The device of claim 1, wherein the second die further comprises:
a primary capacitor connected to the control terminal of each transistor cell in the plurality of transistor cells, the primary capacitor configured to at least partially determine an input impedance of the device.

5. The device of claim 4, wherein each transistor cell in the plurality of transistor cells is connected to the primary capacitor in parallel.

6. The device of claim 1, wherein the plurality of shunt capacitors are configured to filter second order harmonic signals from an input signal to the device.

7. A packaged device, comprising:
a substrate having a ground reference node;
a semiconductor die on the substrate, the semiconductor die including a plurality of transistor cells; and
a plurality of series resonant circuits, each series resonant circuit coupled between one of the plurality of transistor cells and the ground reference node, wherein a first series resonant circuit in the plurality of series resonant circuits resonates at a first resonant frequency, a second series resonant circuit in the plurality of series resonant circuits resonates at a second resonant frequency, and the second resonant frequency is at least 5% greater than the first resonant frequency.

8. The packaged device of claim 7, wherein each of the shunt capacitors is a metal-oxide-silicon capacitor, MOSCAP, formed on a second substrate.

9. The packaged device of claim 7, wherein capacitance values of two adjacent shunt capacitors are significantly different, and wherein the capacitance values of the two adjacent shunt capacitors are selected to compensate for an offset variation in resonant frequencies of two adjacent transistor cells to which the two adjacent capacitors are coupled, wherein the offset variation results from mutual inductances between the sets of wire bonds in the two resonant circuits to which the two adjacent transistor cells are coupled.

10. The packaged device of claim 7, wherein the plurality of series resonant circuits is configured to filter second order harmonic signals from an input signal to the packaged device.

11. The packaged device of claim 7, including an integrated passive device, IPD, on the substrate, the IPD including the shunt capacitors of the plurality of series resonant circuits.

12. The packaged device of claim 7, further comprising a primary capacitor coupled to a control terminal of each one of the plurality of transistor cells, and wherein each one of the shunt capacitors also is coupled to a control terminal of each one of the plurality of transistor cells.

13. A method, comprising:
coupling a semiconductor die to a substrate, the semiconductor die including a plurality of transistor cells; and
electrically connecting a shunt capacitor of a plurality of shunt capacitors to each one of the plurality of transistor cells, wherein a first shunt capacitor in the plurality of shunt capacitors has a first capacitance value, a second shunt capacitor in the plurality of shunt capacitors has a second capacitance value, and the second capacitance value is at least 5% greater than the first capacitance value.

14. The method of claim 13, including coupling a second die to the substrate, wherein the second die includes a primary capacitor and the plurality of shunt capacitors.

15. The method of claim 13, including connecting a plurality of wire bonds between the plurality of shunt capacitors and the plurality of transistor cells, and wherein the shunt capacitors are configured to offset variations in a resonant frequency of each transistor cell in the plurality of transistor cells resulting from mutual inductances between at least two sets of the plurality of wire bonds.

* * * * *